US009620402B2

(12) United States Patent
Kodama et al.

(10) Patent No.: US 9,620,402 B2
(45) Date of Patent: Apr. 11, 2017

(54) ALIGNMENT APPARATUS AND SUBSTRATE PROCESSING APPARATUS

(71) Applicant: TOKYO ELECTRON LIMITED, Tokyo (JP)

(72) Inventors: Toshiaki Kodama, Yamanashi (JP); Toru Yamauchi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 18 days.

(21) Appl. No.: 14/857,656

(22) Filed: Sep. 17, 2015

(65) Prior Publication Data

US 2016/0078626 A1 Mar. 17, 2016

(30) Foreign Application Priority Data

Sep. 17, 2014 (JP) .................................. 2014-188758

(51) Int. Cl.
*G06T 7/00* (2006.01)
*H01L 21/68* (2006.01)

(52) U.S. Cl.
CPC .. *H01L 21/681* (2013.01); *G05B 2219/37224* (2013.01); *G05B 2219/45031* (2013.01); *G05B 2219/45178* (2013.01); *G05B 2219/49112* (2013.01)

(58) Field of Classification Search
CPC .................................................. H01L 21/681
See application file for complete search history.

(56) References Cited

U.S. PATENT DOCUMENTS

| 5,690,785 A * | 11/1997 | Nakaya ..................... G03F 7/20 216/59 |
| 2008/0079920 A1* | 4/2008 | Hommen ............... G03F 7/7085 355/55 |
| 2011/0051111 A1* | 3/2011 | Miyazaki .............. G03F 9/7011 355/67 |
| 2011/0133066 A1* | 6/2011 | Nozoe ................... H01J 37/265 250/252.1 |

FOREIGN PATENT DOCUMENTS

| JP | 2009-129944 | 6/2009 |
| JP | 2009-129945 | 6/2009 |

* cited by examiner

*Primary Examiner* — David F Dunphy

(57) ABSTRACT

An alignment apparatus for aligning a wafer includes a mounting unit, an imaging unit, an elevation unit, and a controlling unit. The control unit outputs a control signal for controlling the elevation unit such that a luminance variation between the outer side and the inner side of the wafer obtained by the imaging unit becomes the same as a luminance variation obtained when the imaging unit is focused, for estimating a warpage state of the wafer based on an amount of relative movement of the imaging unit and the mounting unit with respect to a relative height position of the imaging unit and the mounting unit obtained when the imaging unit is focused on a reference wafer having no warpage, and for detecting the alignment mark of the wafer by the imaging unit by rotating the mounting unit in a state where the imaging unit is focused.

9 Claims, 17 Drawing Sheets

ALIGNMENT APPARATUS AND SUBSTRATE PROCESSING APPARATUS

CROSS-REFERENCE TO RELATED APPLICATIONS

This application claims priority to Japanese Patent Application No. 2014-188758 filed on Sep. 17, 2014, the entire contents of which are incorporated herein by reference.

FIELD OF THE INVENTION

The disclosure relates to an alignment apparatus for optically detecting an alignment mark by imaging a substrate and a substrate processing apparatus including the alignment apparatus.

BACKGROUND OF THE INVENTION

In a semiconductor manufacturing apparatus that is a substrate processing apparatus, a semiconductor wafer (hereinafter, referred to as "wafer") that is a substrate is transferred to a processing module by a transfer unit and subjected to processing. Before the wafer is transferred to the processing module by the transfer unit, the wafer may be transferred to an alignment apparatus so that a direction and a position of a circumferential edge thereof can be detected. The transfer unit receives the wafer from the alignment apparatus to a predetermined location in the processing module to be directed in a predetermined orientation based on the detection result.

Conventionally, a wafer has a cutoff portion referred to as a notch that indicates an orientation thereof. The alignment apparatus is configured to detect the direction of the notch and the position of the circumferential edge of the wafer. However, a recent wafer having a diameter of 450 mm may have a fiducial mark (hereinafter, referred to as "alignment mark") that is a dot-shaped laser mark, instead of the notch, near a circumferential edge of a backside thereof. Therefore, the alignment apparatus has a camera, and the alignment mark and the circumferential edge of the wafer are detected by imaging of the camera.

When the wafer has warpage, a distance between the camera and the wafer becomes different from a design value. In that case, if the camera does not have a function of automatically controlling a focus, i.e., a so-called autofocus function, the camera is not focused on the alignment mark and the circumferential edge of the wafer, which makes the obtained image blurry. As a consequence, the alignment mark cannot be detected, and the detection accuracy of the position of the circumferential edge of the wafer may deteriorate. In the case of using the camera having the autofocus function, the above problem can be avoided. However, such a camera is expensive, which increases a manufacturing cost of the alignment apparatus. Also, in the semiconductor manufacturing apparatus, it is required to accurately transfer the wafer even if it has warpage, or detect the warpage of the wafer to correct the warpage in the apparatus.

As for the alignment apparatus, there is disclosed in, e.g., Japanese Patent Application Publication No. 2009-129945, an apparatus for detecting a position of a circumferential edge of a wafer by moving a camera in a vertical direction and a diametrical direction of the wafer to follow an edge of the wafer based on a detection result of a displacement sensor. However, the configuration of the movable camera and the displacement sensor results in scaling up of the alignment apparatus. In addition, Japanese Patent Application Publication No. 2009-129944 discloses an alignment apparatus for detecting a position of a circumferential edge of a wafer by calculating an approximate equation indicating a cross sectional shape of the wafer having warpage based on a detection result of a displacement sensor. However, the alignment apparatus of Japanese Patent Application Publication No. 2009-129944 is disadvantageous in that the apparatus configuration may be scaled up due to the presence of the displacement sensor. Further, the alignment apparatus of Japanese Patent Application Publication No. 2009-129944 does not include a camera, and cannot solve the above-described problem.

SUMMARY OF THE INVENTION

In view of the above, the disclosure provides a technique capable of detecting an alignment mark formed at a backside of a wafer with high accuracy and estimating a warpage state of the wafer by using an apparatus having a simple configuration.

The disclosure provides an alignment apparatus for aligning a wafer that is a circular substrate in a predetermined orientation by optically detecting an alignment mark formed at a backside of the wafer by rotating a mounting unit on which the wafer is mounted. The alignment apparatus includes an imaging unit configured to image, from a position below the wafer, an imaging region having a strip shape extending in a diametrical direction of the wafer across a periphery of the wafer, an elevation unit configured to relatively move up and down the mounting unit or the imaging unit with respect to each other, and a control unit configured to output a control signal for controlling the elevation unit such that a luminance variation between an outer side and an inner side of the wafer in a luminance distribution pattern in the diametrical direction of the wafer which is obtained by the imaging unit becomes the same as a luminance variation obtained when the imaging unit is focused, for estimating a warpage state of the wafer based on an amount of relative movement of the imaging unit and the mounting unit with respect to a relative height position of the imaging unit and the mounting unit which is obtained when the imaging unit is focused on a reference wafer having no warpage, and for detecting the alignment mark of the wafer by the imaging unit by rotating the mounting unit in a state where the imaging unit is focused, and a substrate processing apparatus including such alignment apparatus.

In this disclosure, the relative height of the mounting unit with respect to the imaging unit is controlled based on the variation of the luminance in the luminance distribution pattern in the diametrical direction of the wafer which is obtained by the imaging unit. Accordingly, the imaging unit is focused and the alignment mark of the wafer is detected. Further, the warpage state of the wafer is estimated based on the elevation amount required for the height control. Hence, there is no need to use a camera that is automatically focused on a subject. As a result, it is possible to detect the alignment mark with high accuracy and estimate the warpage state of the wafer with a simple configuration of the apparatus.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
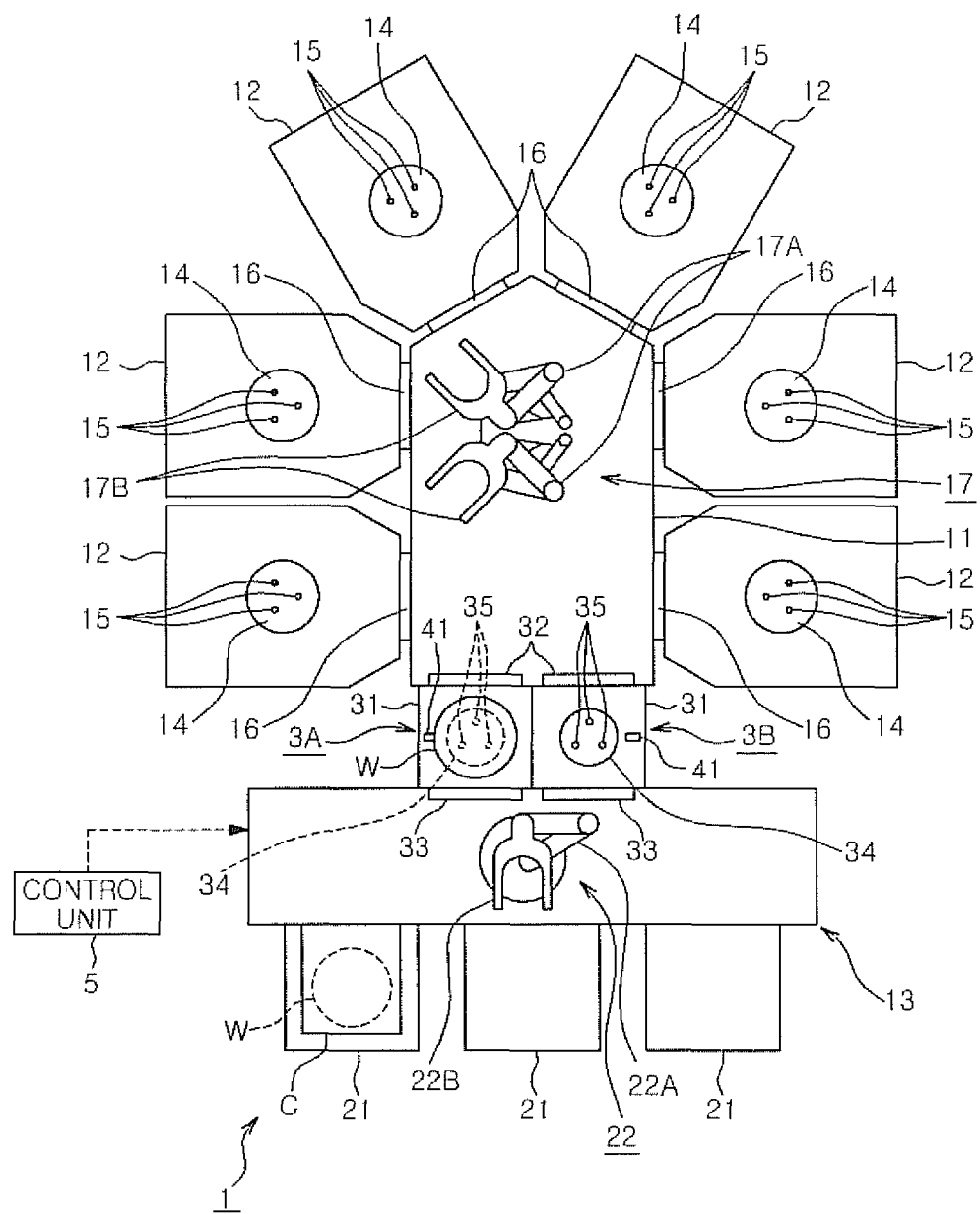
FIG. 1 is a horizontal cross sectional top view showing a substrate processing apparatus including an alignment apparatus of the disclosure.

A substrate processing apparatus 1 according to an embodiment will be described with reference to the schematic top view of FIG. 1. The substrate processing apparatus 1 that is a semiconductor manufacturing apparatus performs plasma treatment on wafers W one at a time. A wafer W has a diameter of, e.g., 450 mm. The substrate processing apparatus 1 includes, when viewed from the top, elongated pentagonal transfer module 11; six processing modules 12 arranged radially around the transfer module 11 and connected to the transfer module 11; a loader module 13 disposed to face the transfer module 11; and two load-lock modules 3A and 3B disposed between the transfer module 11 and the loader module 13.

Each of the processing modules 12 has a vacuum chamber. Provided in the vacuum chamber is a stage 14 for mounting thereon the wafer W. In FIG. 1, a reference numeral 15 denotes elevating pins for transferring the wafer W to and from a first wafer transfer unit 17 to be described later by elevating the wafer W from the surface of the stage 14. In each of the processing modules 12, after the wafer W is mounted on the stage 14, the inside of the vacuum chamber is set to a predetermined vacuum level. Then, a processing gas is introduced into the vacuum chamber and a high frequency power is applied into the vacuum chamber. As a consequence, plasma is generated and the wafer W is subjected to plasma treatment such as etching or the like by the plasma thus generated. The processing modules 12 and the transfer module 11 are partitioned by openable/closable gate valves 16.

The inside of the transfer module 11 is maintained in a vacuum atmosphere. Provided in the transfer module 11 is the first wafer transfer unit 17 including two SCARA-type transfer arms 17A and a guide rail (not shown). Each of the transfer arms 17A is configured to be rotatable and extensible/contractible. An end effector 17B for mounting and holding the wafer W thereon is provided at a leading end of each transfer arm. The first wafer transfer unit 17 is configured to be movable along a lengthwise direction of the transfer module 11 along the guide rail. The first wafer transfer unit 17 is also configured to transfer the wafer W between the transfer module 11, the processing modules 12, and the load-lock modules 3A and 3B.

The loader module 13 is configured as a rectangular parallelepiped transfer chamber maintained in an atmospheric atmosphere. The load-lock modules 3A and 3B are connected to one side surface of the loader module 13 which extends along the lengthwise direction. Provided at the other side surface are carrier mounting tables 21, each for mounting thereon a carrier C that is a container accommodating a plurality of wafers W. In this example, three carrier mounting tables 21 are provided.

A second wafer transfer unit 22 for transferring the wafer W is provided in the loader module 13. The second wafer transfer unit 22 includes a guide rail (not shown) and a SCARA arm type transfer arm 22A. The transfer arm 22A is configured to be movable along the lengthwise direction of the loader module 13 along the guide rail. The transfer arm 22A is also configured to be rotatable and extensible/contractible. As in the case of the first wafer transfer unit 17, the second wafer transfer unit 22 has at a leading end of the transfer arm 22A an end effector 22B for mounting and holding the wafer W. The second wafer transfer unit 22 is configured to transfer the wafer W between the carrier C on the carrier mounting table 21 and the load-lock modules 3A and 3B.

Each of the load-lock modules 3A and 3B is configured as a chamber having an inner space that can be switched between a vacuum atmosphere and an atmospheric atmosphere. Further, each of the load-lock modules 3A and 3B serves as an alignment apparatus for detecting the alignment mark and the position of the circumferential edge of the wafer W and transfers the wafer W to a predetermined position on the end effector 17B of the first wafer transfer unit 17 or a predetermined position on the end effector 22B of the second wafer transfer unit 22 such that the wafer W is directed in a predetermined orientation.

Figure 2:
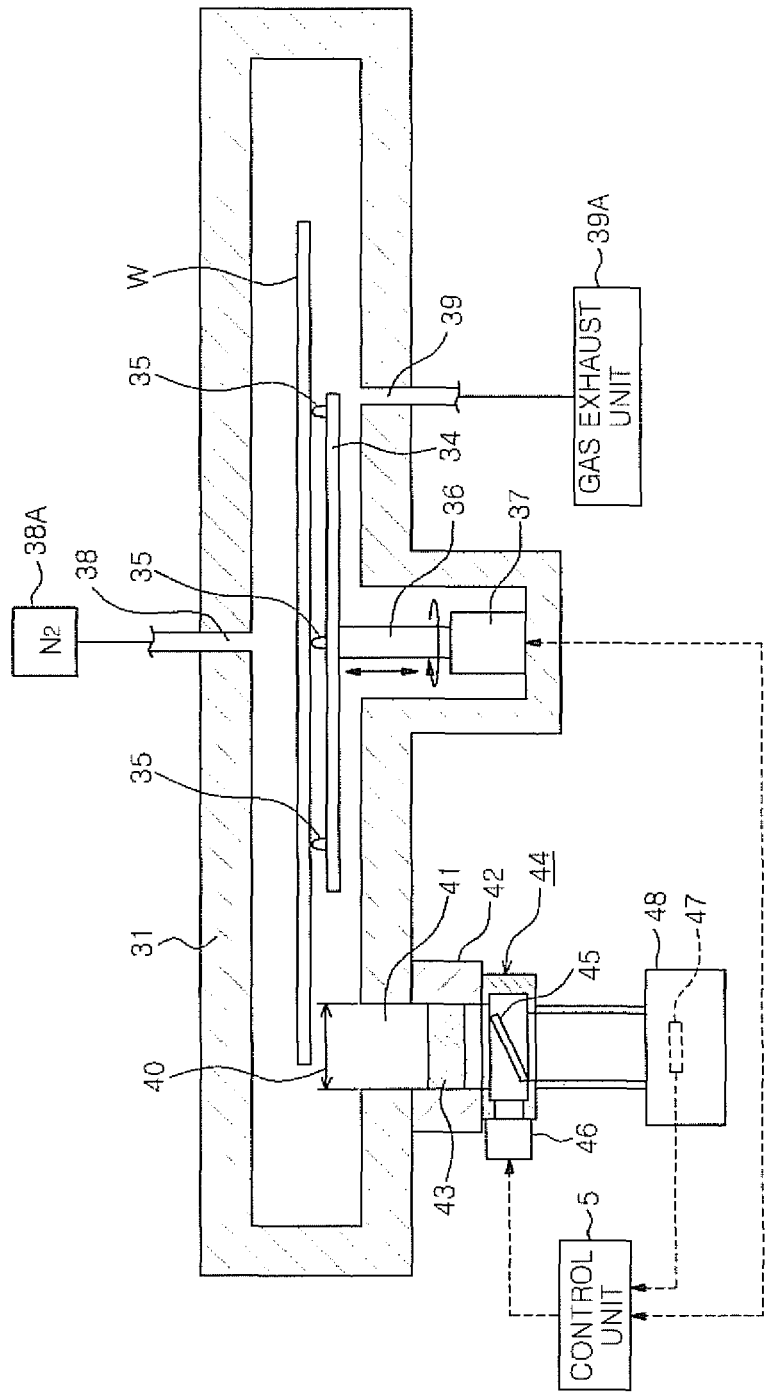
FIG. 2 is a vertical cross sectional side view showing a load-lock module of the alignment apparatus.

Between the load-lock modules 3A and 3B, the load-lock module 3A will be representatively described with reference to the vertical cross sectional side view of FIG. 2. In FIG. 2, a reference numeral 31 denotes a chamber of the load-lock module 3A. The chamber is connected to the transfer module 11 and the loader module 13 via gate valves 32 and 33, respectively (see FIG. 1). A horizontal circular stage 34 for mounting thereon the wafer W is provided in the chamber 31. Three pins 35 for supporting the backside of the wafer W are provided on the surface of the stage 34. The stage 34 has a diameter smaller than a diameter of the wafer W so that the backside of the peripheral portion of the wafer W mounted on the stage 34 can be imaged. The stage 34 is connected to a driving unit 37 thereon a vertical shaft 36. The wafer W mounted on the stage 34 is rotated about the vertical axis and vertically moved by the driving unit 37. The wafer W is mounted on the stage 34 such that the center of the wafer W coincides with or substantially coincides with the rotation center of the stage 34. The position of the center of the wafer W is calculated from the position of the circumferential edge of the wafer W.

A gas supply port 38 and a gas exhaust port 39 are formed at a wall of the chamber 31. For example, an $N_2$ gas supply 38A is connected to the gas supply port 38 thereon a gas supply line. A gas exhaust unit 39A including a vacuum pump or the like is connected to the gas exhaust port 39 thereon a gas exhaust line. The inner space of the chamber 31 can be switched between an atmospheric atmosphere and a vacuum atmosphere by the supply of $N_2$ gas thereon the gas supply port 38 and the gas exhaust thereon the gas exhaust port 39.

An opening 41 is formed at a bottom surface of the chamber 31. The opening 41 is vertically opened to face the circumferential edge of the wafer W mounted on the stage 34. At the outside of the chamber 31, a ring member 42 is provided around the peripheral edge of the opening 41. The opening of the ring member 42 is blocked by a transmission window 43 that transmits light. An optical unit 44 is provided below the ring member 42. The optical unit 44 includes a half mirror 45 and a light source 46. A camera 48 including an imaging device 47 and a lens (not shown) is connected to the bottom of the optical unit 44 so that an imaging region 40 in the chamber 31 can be imaged. The imaging direction of the camera 48, i.e., the optical axis of the lens, is directed vertically upward.

The camera 48 is a fixed focus camera and thus has a fixed depth of field. In other words, the camera 48 is focused within a fixed predetermined vertical range in the chamber 31. The imaging region 40 of the camera 48 is provided, across a periphery of the wafer W, in a strip shape extending in a diametrical direction of the wafer W mounted on the stage 34. In other words, a part of the circumferential edge of the wafer W is locally imaged together with an outside region thereof. The imaging region 40 may be slightly misaligned from the diametrical direction of the wafer W.

Figure 3:
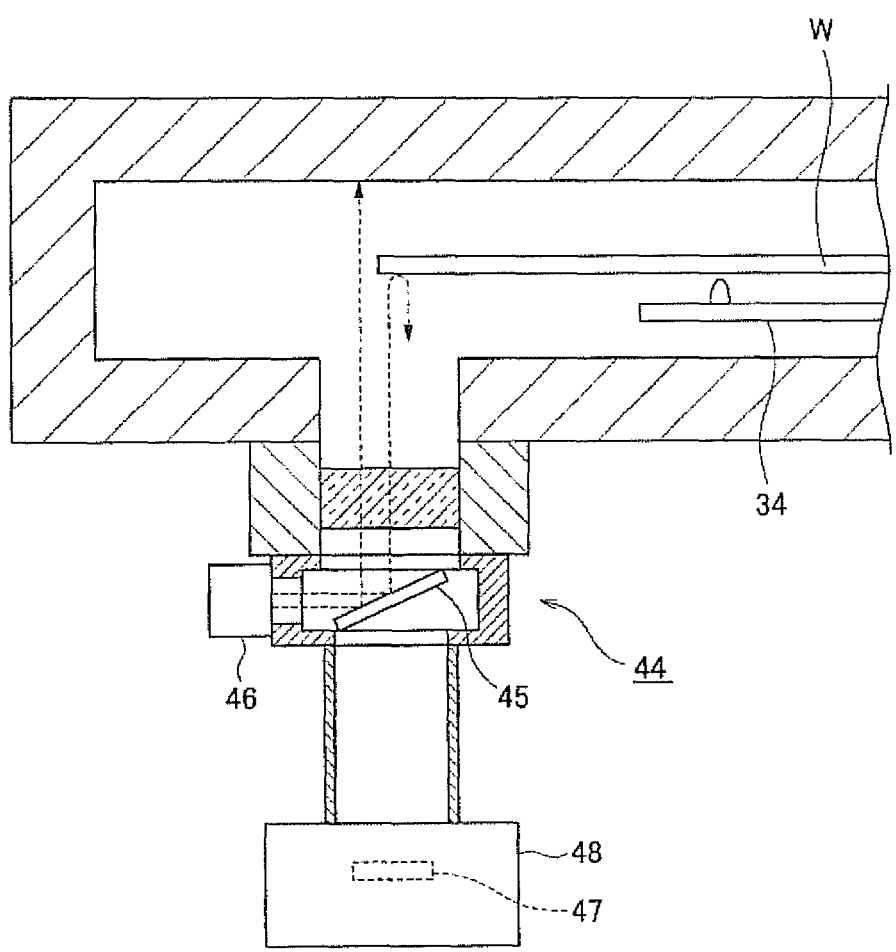
FIG. 3 explains an optical path in the load-lock module.

FIG. 3 shows as arrows optical paths formed by irradiating the light from the light source 46. The light is irradiated sideward from the light source 46 into the optical unit 44. Then, the light is reflected by the half mirror 45 and directed upward. Accordingly, the light is irradiated to a circumferential edge of the backside of the wafer W mounted on the stage 34 and the ceiling portion of the chamber 31. The light irradiated to the ceiling portion of the chamber 31 is absorbed, whereas the light irradiated to the backside of the wafer W is reflected downward. In a state where the light is irradiated and reflected, the imaging using the camera 48 is carried out. A data signal is output from the imaging device 47 to the control unit 5. The data signal contains information on luminance of each location in the imaging region of the camera 48. Hereinafter, such a data signal will be referred to as "luminance data". The control unit 5 that is a computer to be described later obtains an image of the imaging region 40.

Figure 4:
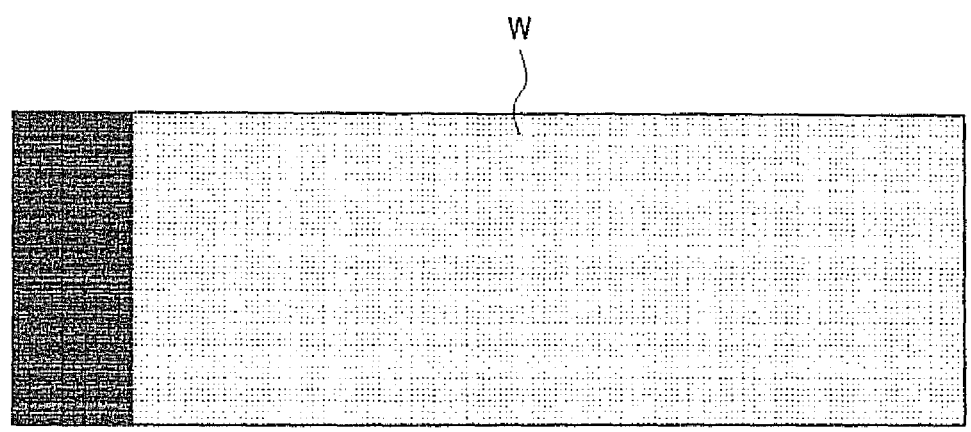
FIG. 4 schematically shows an example of an image of a wafer which is obtained in the load-lock module.
Figure 5:
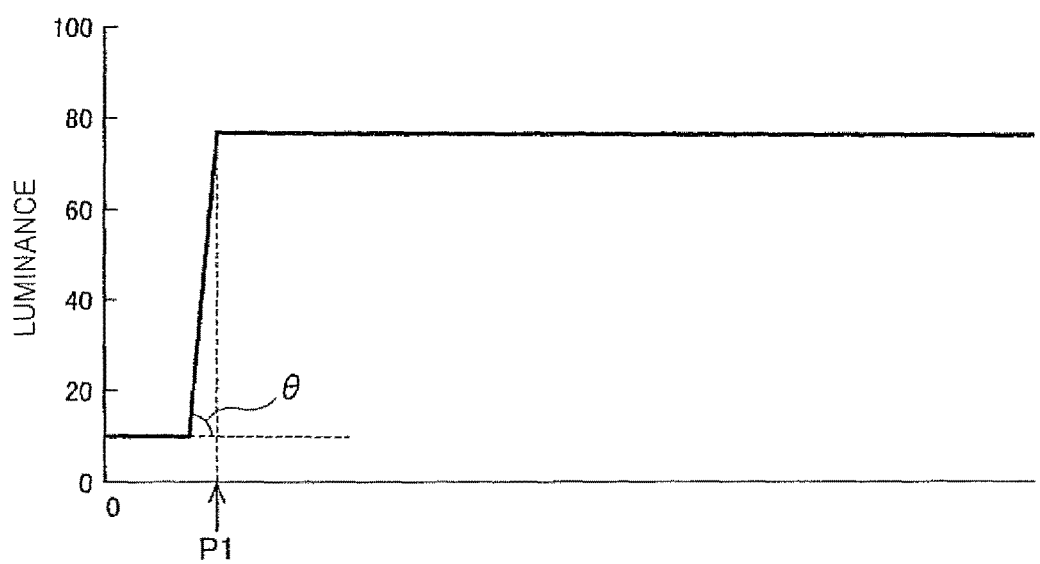
FIG. 5 is a schematic graph showing luminance distribution obtained in the load-lock module.

FIGS. 4 and 5 are respectively an image obtained from the luminance data acquired when the wafer W is horizontal without being warped as shown in FIG. 3, and a graph showing a relationship between the luminance and the position of the imaging region. A lengthwise direction (right-left direction in FIG. 4) of the image shown in FIG. 4 corresponds to the diametrical direction of the wafer W. As described above, the light absorptivity is higher at the backside of the wafer W than at the outside of the wafer W. Therefore, the image of the backside of the wafer W is brighter than the image of the outside of the wafer W. The vertical axis of the graph shown in FIG. 5 represents the luminance of the image. As a numerical value in the vertical axis increases, the luminance of the image becomes higher. A position in the horizontal axis of the graph represents a position in the image region 40 in the diametrical direction of the wafer W. A numerical value of zero in the horizontal axis of the graph corresponds to one end of the imaging region 40. A larger numerical value in the horizontal axis indicates a position closer to the other end of the imaging region 40. In other words, positions in the horizontal axis correspond to positions in the lengthwise direction of the image shown in FIG. 4. Hereinafter, a graph of a luminance distribution pattern in the imaging region 40, such as the graph of FIG. 5, will be referred to as a luminance distribution graph.

Since the light absorptivity is different between the backside of the wafer W and the outside of the wafer W as described above, the luminance abruptly decreases at a certain point when viewed from the inner side toward the outer side of the wafer W in the diametrical direction in the waveform of the luminance distribution graph of FIG. 5. The position of the imaging region 40 which corresponds to such a point indicates the circumferential edge of the wafer W. Such a position is denoted as P1 in FIG. 5. Accordingly, the position of the circumferential edge of the wafer W can be detected by detecting the position where the luminance abruptly decreases in the luminance distribution graph (the position where the luminance abruptly increases when viewed from the outer side to the inner side of the wafer W in the diametrical direction).

Figure 6:
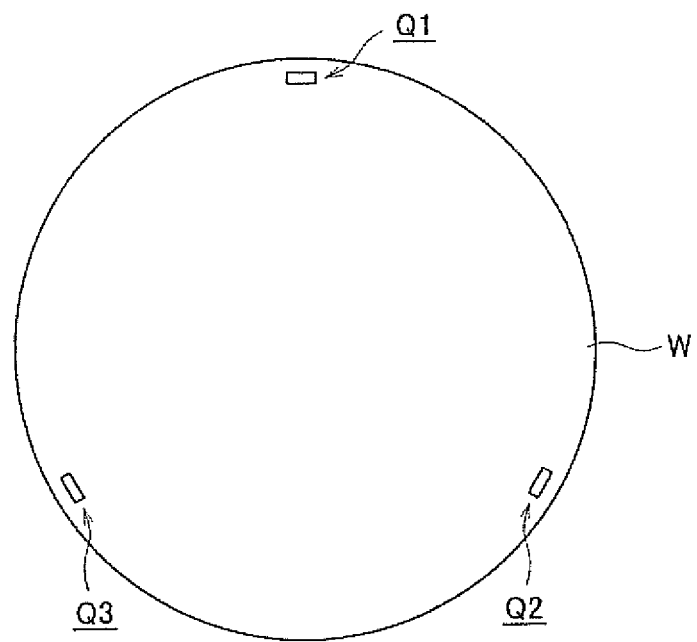
FIG. 6 is a plan view showing a backside of the wafer.

FIG. 6 shows the backside of the wafer W. Alignment marks Q1 to Q3 are formed at the peripheral portion of the backside of the wafer W while being spaced from each other at a regular interval along the circumferential direction. Each of the alignment marks Q1 to Q3 includes a plurality of dot-shaped laser marks arranged at a regular interval. The laser marks of the alignment marks Q1 to Q3 form different shapes. In FIG. 6, a region where the alignment is formed is surrounded by a frame and such frames are denoted as Q1 to Q3, for convenience of illustration. However, the dot-shaped laser marks are actually formed inside each frame. By detecting the alignment marks Q1 to Q3, the orientation of the wafer W can be detected. Since the stage 34 rotates, the alignment marks Q1 to Q3 are included in the imaging region. The alignment marks Q1 to Q3 are provided near the circumferential edge of the wafer W. In the process of focusing the camera 48 which will be described later, the camera 48 is focused on the alignment marks Q1 to Q3 and the circumferential edge of the wafer W.

Figure 7:
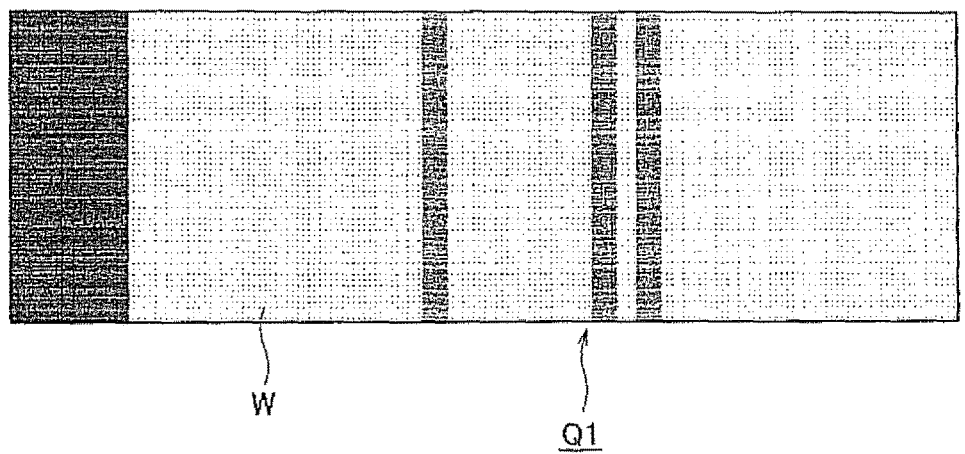
FIG. 7 schematically shows an example of an image of the wafer which is obtained in the load-lock module.
Figure 8:
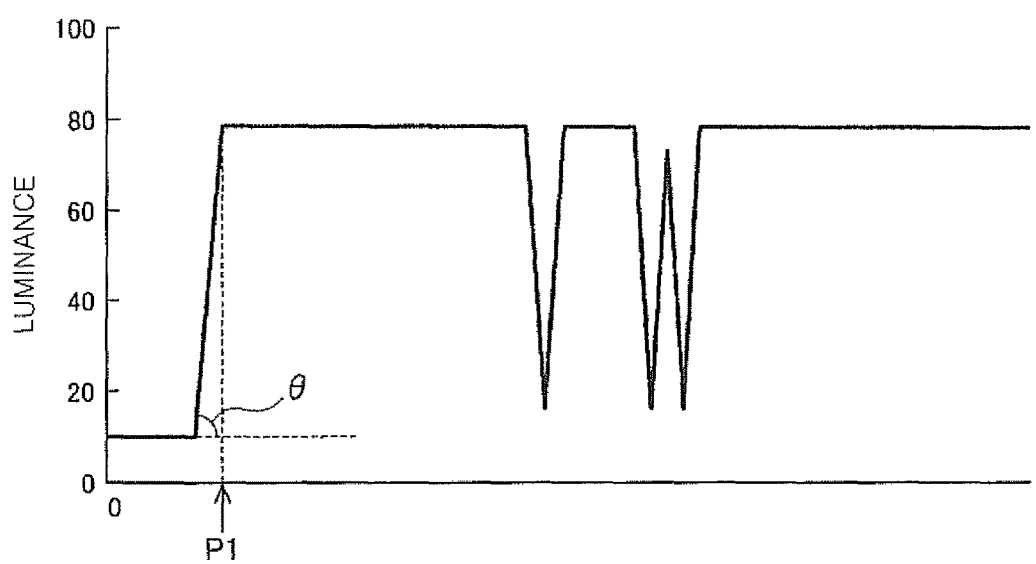
FIG. 8 is a schematic graph showing luminance distribution obtained in the load-lock module.

FIGS. 7 and 8 show an image obtained from the luminance data output from the camera 48 that has imaged the alignment mark Q1 and the luminance distribution graph, respectively. In the image, the wafer W is horizontal without being warped as shown in FIG. 3. The reflectivity of the light irradiated upwardly is lower at the alignment marks Q1 to Q3 than at the neighboring region. Therefore, the alignment marks Q1 to Q3 are illustrated darkly in the image of FIG. 7. As shown in FIG. 8, the waveform having a plurality of sharp peaks is shown in the luminance distribution graph. Therefore, the alignment mark Q1 can be detected from the waveform. The alignment marks Q2 and Q3 can also be detected from the waveform of the graph. Further, the alignment marks Q1 to Q3 can be distinguished from one another based on the shape of the waveform. The detection of the alignment marks Q1 to Q3 and the detection of the circumferential edge of the wafer W are performed by the control unit 5. For convenience of description, fine luminance variation is omitted in the luminance distribution graphs of FIGS. 8 and 5. In the drawings showing the images, brightness and darkness are schematically illustrated, for convenience.

Figure 9:
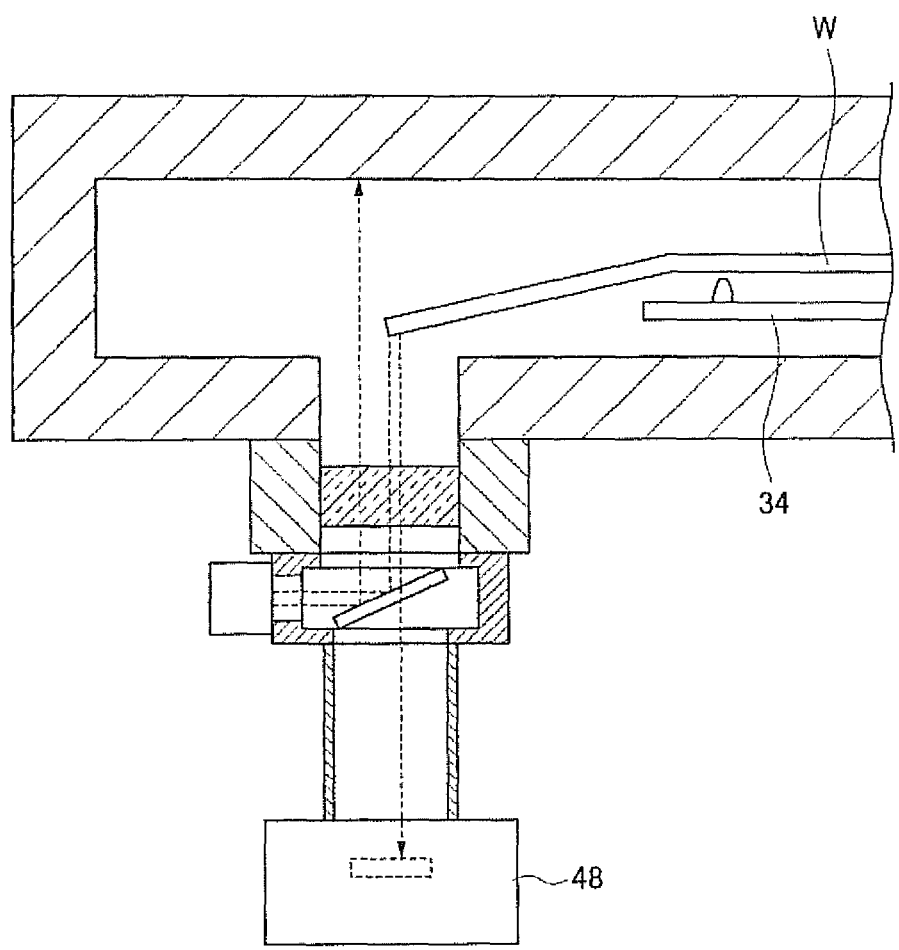
FIG. 9 explains an optical path in the load-lock module.
Figure 10:
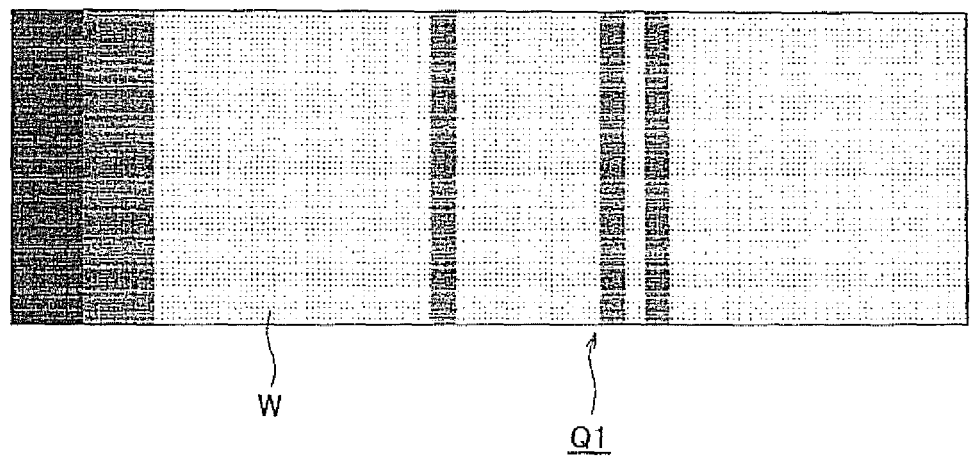
FIG. 10 schematically shows an example of an image of the wafer which is obtained in the load-lock module.
Figure 11:
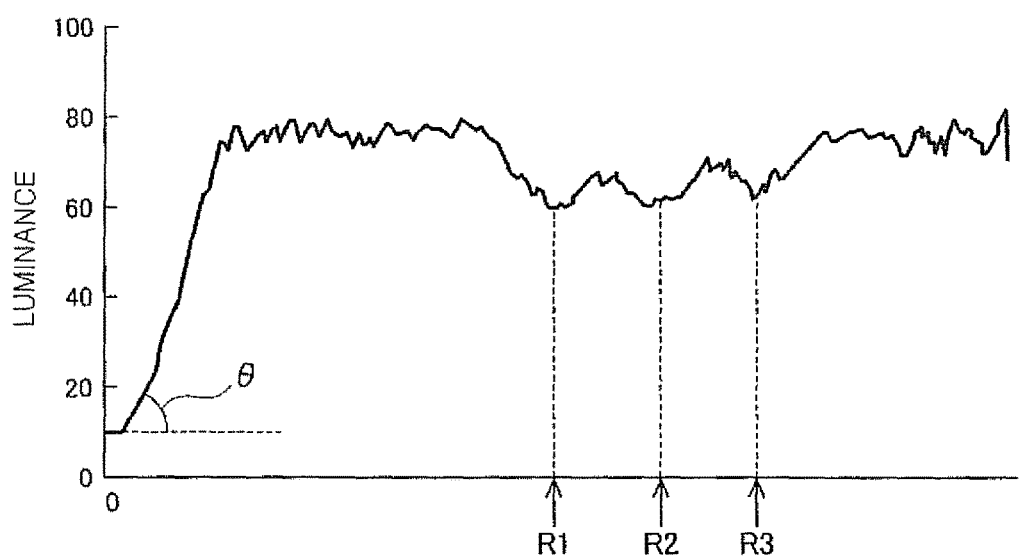
FIG. 11 is a graph showing luminance distribution obtained in the load-lock module.

FIG. 9 shows an example in which the wafer W to be imaged is warped. Since the focus of the camera 48 is fixed, a large warpage of the wafer W prevents the camera 48 from being focused on the circumferential edge of the wafer W, and the image obtained from the luminance data becomes blurry. FIGS. 10 and 11 show the image from the luminance data obtained in a state where the camera 48 is not focused and the luminance distribution graph, respectively. The luminance data is obtained by imaging the region including the alignment mark Q1. Positions R1 to R3 on the horizontal axis of the luminance distribution graph correspond to the positions where the alignment mark Q1 is provided. The waveform at the positions R1 to R3 does not have sharp peaks as shown in FIG. 8, so that it is not possible to accurately detect the alignment mark Q1 from the luminance distribution graph shown in FIG. 11. In the same manner, the alignment marks Q2 and Q3 may not be detected. Further, it is not possible to accurately detect the position of the circumferential edge of the wafer W from the luminance data obtained in a state where the camera 48 is not focused.

Therefore, in the load-lock module 3A, the camera 48 is configured to be focused on a certain portion of the periphery of the wafer W. Hereinafter, the focusing operation will be described. In the luminance distribution graph, when the camera 48 is focused on the wafer W, high correspondence is obtained between the luminance of the circumferential edge of the wafer W and the luminance of the outside of the wafer W in the image and the actual brightness and darkness of the imaging region 40 of the camera 40. Thus, an inclination angle θ of the graph which is shown at the boundary between the circumferential edge of the wafer W and the outside of the wafer W is large as shown in the luminance distribution graphs of FIGS. 5 and 8. On the other hand, when the camera 48 is not focused, a low correspondence is obtained. Thus, the inclination angle θ is small as shown in the luminance distribution graph of FIG. 11. The inclination angle θ or a value close thereto can be calculated by differentiating the data (curve) of the luminance distribution graph at each point. In FIGS. 8 and 11, the angle θ is measured at a point where the luminance distribution graph starts to be increased, for convenience. However, it may be measured at a point where the graph is increasing.

Figure 12:
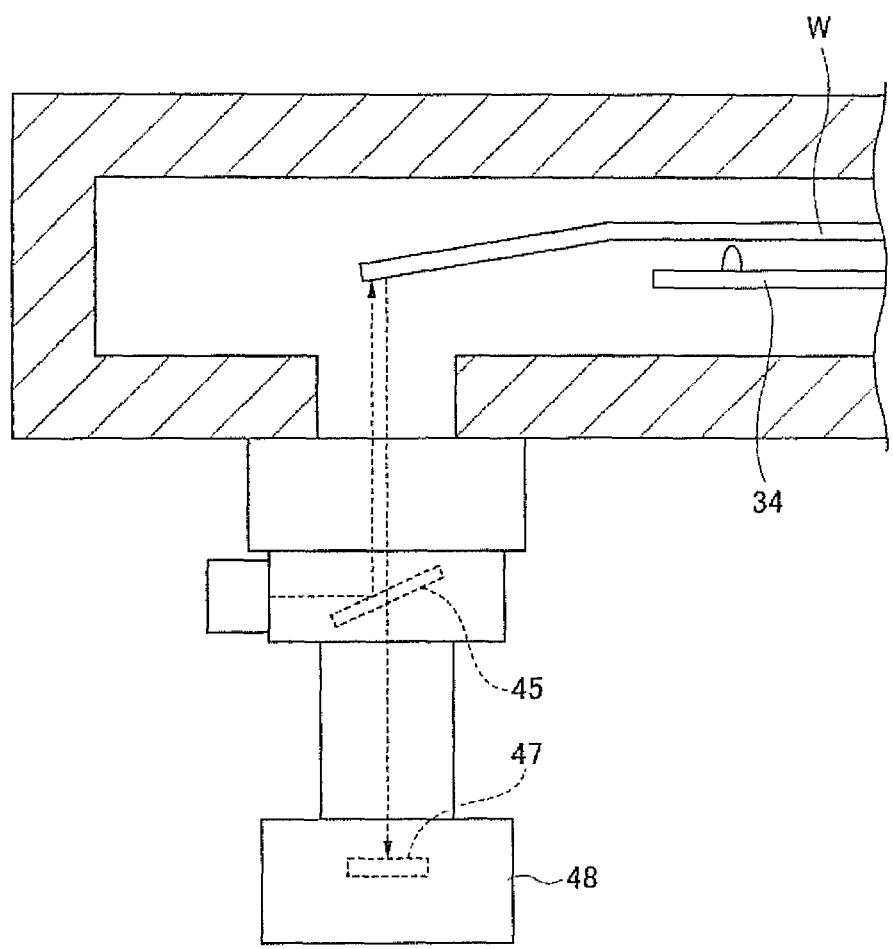
FIG. 12 explains a state in which a camera is focused on a warped wafer in the load-lock module.

The control unit 5 detects the inclination angle θ and vertically moves the stage 34 such that the angle θ becomes a tolerable value. Accordingly, the camera 48 is focused on the peripheral portion of the backside of the wafer W. In other words, in the luminance distribution pattern, the height of the stage 34 is controlled such that the variation (the inclination angle θ) of the luminance between the outer side and the inner side of the wafer W becomes the same as the variation of the luminance obtained when the camera 48 is focused on the wafer W. FIG. 12 shows, as an example, a state in which the camera 48 is focused by raising the stage 34 from the height position shown in FIG. 9. By performing the focusing operation, the shape of the luminance distribution graph is changed from that shown in FIG. 11 to that shown in FIG. 8. In the above, the detection of the inclination angle θ was schematically described for better understanding. To be more specific, in order to calculate the inclination angle, a moving average of the luminance is obtained and a deviation between adjacent data is obtained by removing ripples in the graph. Then, an average of the deviation is obtained in the section where the deviation is within a set range. By setting the inclination angle θ to the tolerable value, the average of the deviation becomes a predetermined value that allows the focusing state. In other words, the variation of the luminance in a predetermined section in the imaging region 40 is set to a predetermined value.

The control unit 5 estimates the warpage state of the wafer W based on the elevation amount of the stage 34 which is required for the focusing operation. Here, the warpage state includes the direction and the amount of warpage in the entire circumference of the wafer W. The wafer W may be warped upwardly or downwardly. In this example, the warpage state is estimated based on the elevation amounts which are measured at four locations of the circumferential edge of the wafer W while rotating the stage 34 by 90°.

Hereinafter, the estimation of the warpage state will be described in detail. The camera 48 is focused on a predetermined position)(0° (=360° position) of the circumference of the wafer W. Then, the wafer W is rotated by 90° and the camera 48 is focused on a 90° position. The deviation (elevation correction amount) of the height of the stage 34 at the 90° position with respect to the height of the stage 34 at the 0° position is obtained. Next, the wafer W is rotated by 90° and the camera 48 is focused on a 180° position. In the same manner, the elevation correction amount is obtained. Thereafter, the wafer W is rotated by 90° and the camera 48 is focused on a 270° position. In the same manner, the elevation correction amount is obtained. The obtained elevation correction amounts are plotted in a coordinate system of FIG. 13 where the vertical axis represents a corrected elevation amount and the horizontal axis represents a circumferential position of the wafer W. The elevation correction amount at the 0° position is zero.

A curve fitting is performed based on the plots by a predetermined algorithm. For example, a spline curve R passing through the plots is obtained and this is considered as an estimated warpage state of the wafer W. In other words, it is considered that the variation of the actual height of the stage 34 with respect to the height of the stage 34 which is measured when a reference wafer having no warpage is imaged corresponds to the warpage of the wafer W. As the warpage of the wafer W is reduced, the fluctuation of the spline curve R is reduced. The wafer W is warped upwardly as the elevation correction amount expressed by the spline curve R is increased at a certain circumferential position of the wafer W.

Hereinafter, the configuration of the substrate processing apparatus 1 will be described. The load-lock module 3B has the same configuration as that of the load-lock module 3A. In the load-lock module 3B, the pressure in the chamber 31 is controlled and the position of the circumferential edge of the wafer W and the alignment marks Q1 to Q3 are detected. The load-lock module 3B is used for transferring the wafer W from the transfer module 11 to the loader module 13. The load-lock module 3A is used for transferring the wafer W from the loader module 13 to the transfer module 11.

Next, the control unit 5 of the substrate processing apparatus 1 will be described with reference to the block diagram of FIG. 14. The control unit 5 includes a program 51, a CPU 52 for performing various operations, a display device 53 having a display or the like, and a memory 54. The program 51 has commands (steps) for sending a control signal to each component of the substrate processing apparatus 1 and processing and transferring the wafer W. A determination process to be described later is performed by the program 51. The program 51 is stored in a program storage unit 56 that is a computer storage medium, e.g., a flexible disk, a compact disk, a hard disk, a MO (magneto-optical disk), a memory card or the like, and installed in the control unit 5.

Figure 14:
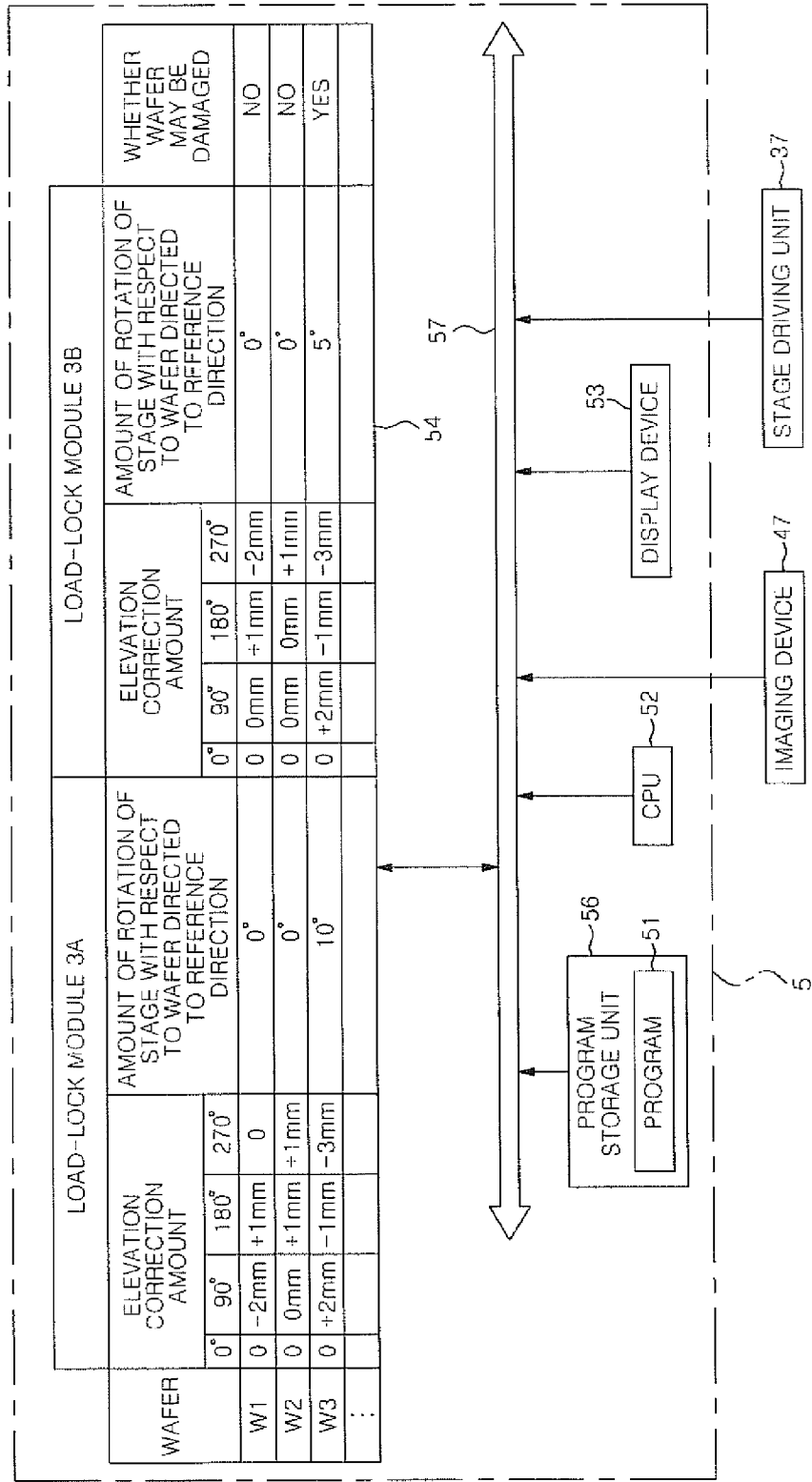
FIG. 14 shows a configuration of a control unit of the substrate processing apparatus.

A reference numeral 57 in FIG. 14 denotes a bus connected to the program storage unit 56, the memory 54, the CPU 52, and the display device 53. The bus 57 is also connected to the driving unit 37 of the stage and the imaging device 47 of the camera 48.

In the memory 54, the elevation correction amount obtained at each position of the circumference of the wafer W in the load-lock modules 3A and 3B is made to correspond to an ID of the wafer W and stored in the memory 54. Further, whether or not the wafer W may be damaged is determined based on the spline curve R obtained in the load-lock module 3B. The determination result is made to correspond to the ID of the wafer W and stored in the memory 54.

Figure 13:
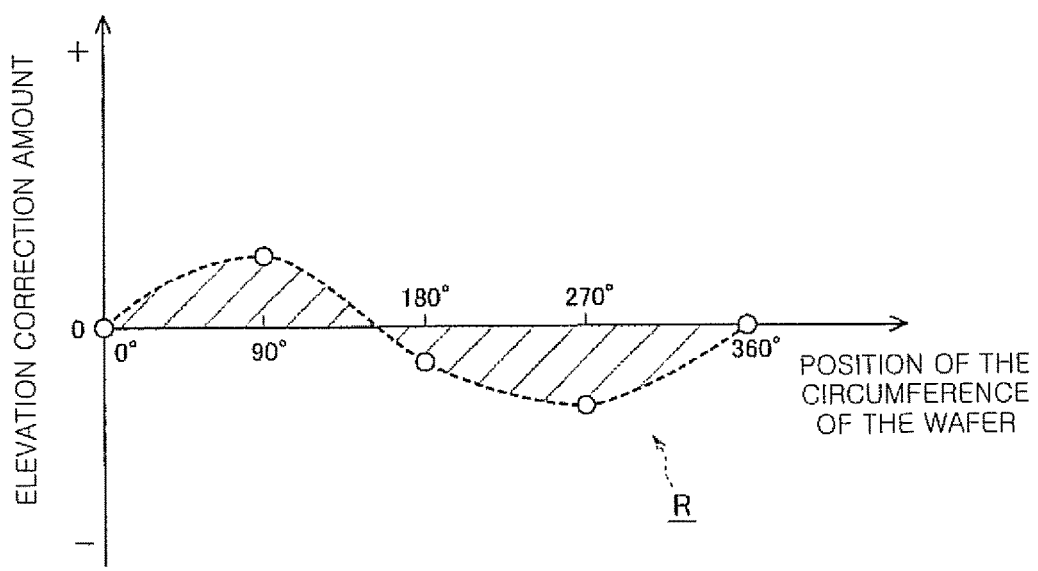
FIG. 13 is a graph corresponding to a height of a circumferential edge of the wafer.

Whether or not the wafer W may be damaged is determined by calculating an area of a region surrounded by the spline curve R and the horizontal axis of the graph (an area of a shaded region in FIG. 13, referred to as "area corresponding to warpage" and determining whether or not the calculated value exceeds a reference value. It may also be determined by a Peak to Peak value of the spline curve R. When the calculated value exceeds the reference value, it is determined that the wafer W has large warpage and may be damaged. When the calculated value is smaller than the reference value, it is determined that the wafer W is not damaged. In other words, it is considered that the warpage of the wafer W is increased as the area corresponding to warpage is increased. Before the wafer W is transferred to a device for performing a next process in the substrate processing apparatus 1, the control unit 5 selects a wafer W by determining whether or not the wafer W may be damaged.

In the load-lock module 3A, the position of the circumferential edge of the wafer W is detected along the entire circumference of the wafer W. The central position of the wafer W is calculated based on the above detection result. When the wafer W on the stage 34 of the load-lock module 3A is exchanged by the end effector 17B of the first wafer transfer unit 17, the stage 34 allows the detected alignment marks Q1 to Q3 to direct in a reference orientation. The position of the end effector 17B that is moved toward the backside of the wafer W is controlled based on the calculated central position of the wafer W. When the stage 34 is lowered, the center of the wafer W is located at a predetermined position on the end effector 17B and the wafer W is transferred in a state where the alignment marks Q1 to Q3 are directed in a predetermined orientation.

Figure 15:
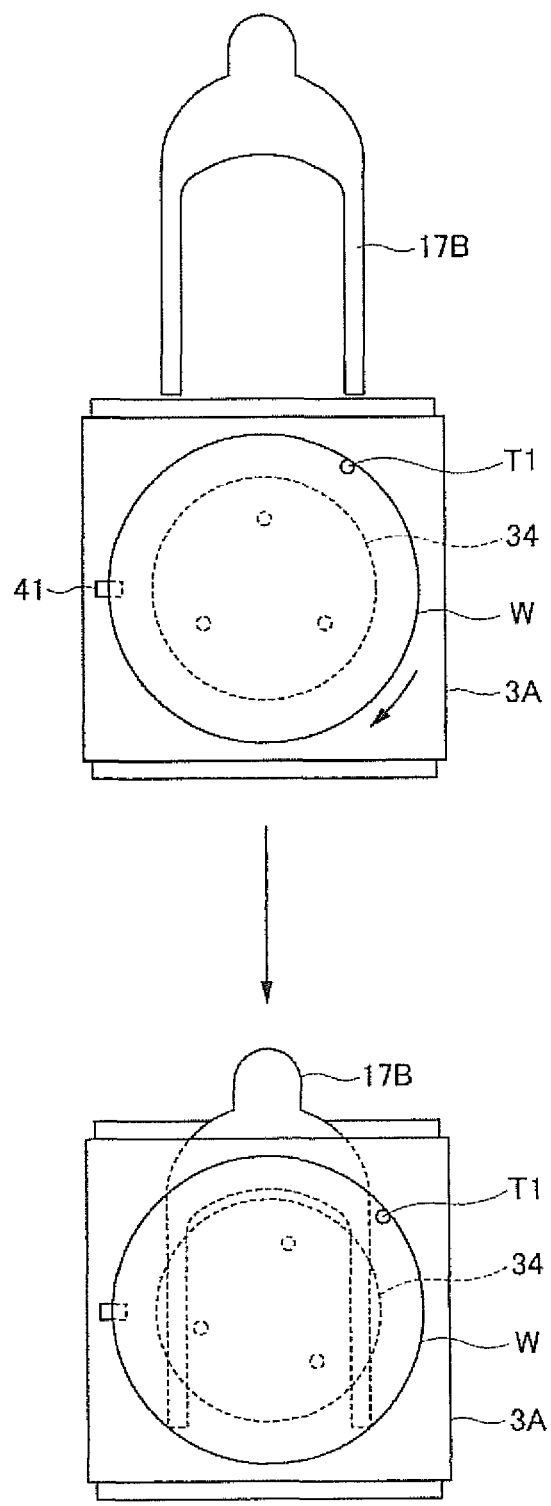
FIG. 15 explains an operation of receiving a substrate from the load-lock module by a transfer unit.

Before the wafer W is received by the end effector 17B, it is determined, based on the estimated warpage state of the wafer W, whether or not the distortion caused by the warpage is large at the circumferential position of the wafer W which is brought into contact with the end effector 17B when receiving the wafer W directed in the reference orientation. When it is determined that the distortion is large, the wafer W is received by the end effector 17B after the stage 34 is rotated such that the circumferential position of the wafer W which has small distortion is brought into contact with the end effector 18B (see FIG. 15). The central position of the wafer W received by the end effector 17B is not changed by the warpage state of the wafer W. However, the direction of the wafer W may be changed by the warpage state. In FIG. 15, a point where the distortion caused by the warpage is large is denoted as TI.

In the above, there has been described the case where the wafer W is received by the end effector 17B of the first wafer transfer unit 17 and transferred to the load-lock module 3A. In the same manner, the wafer W is received by the end effector 22 of the second wafer transfer unit 22 and transferred to the load-lock module 3B. For each of the load-lock modules 3A and 3B, the rotation amount of the orientation of the stage 34 in the case of actually receiving the wafer W with respect to the orientation of the stage 34 which makes the wafer W direct in the reference orientation is stored in the memory 54 in association with the ID of the wafer W. Therefore, a tester can refer to the rotation amount in the case of executing various tests for a semiconductor device manufactured from the wafer W.

Next, an example of a technique for determining the rotation amount of the stage 34 will be described. After the spline curve R shown in FIG. 13 is obtained as the estimated warpage state of the wafer W, the circumferential position of the wafer W which is brought into contact with the end effectors 17B and 22B when receiving the wafer W directed in the reference orientation is specified. Then, an inclination of a tangent line of the spline curve R at the specified circumferential position is obtained. It is considered that the distortion of the circumferential position which is caused by the warpage is increased as the inclination of the tangent line is increased. When the inclination is not within the tolerance range, the circumferential position of the wafer W which is brought into contact with the end effectors 17B and 22*b* by rotating the stage 34 by A° is specified. Next, the inclination of the tangent line at the specified circumferential position is obtained and whether or not the inclination is within a tolerance range is determined. If it is determined that the inclination is within the tolerable range, the circumferential position of the wafer W which is brought into contact with the end effectors 17B and 22B by rotating the stage 34 by A° is specified. Then, the inclination of the tangent line of the spline curve R at the specified circumferential position is obtained and whether or not the inclination is within the tolerance range is determined. The above process is performed until it is determined that the inclination is within the tolerable range. Accordingly, the rotation amount of the stage 34 is determined.

Figure 16:
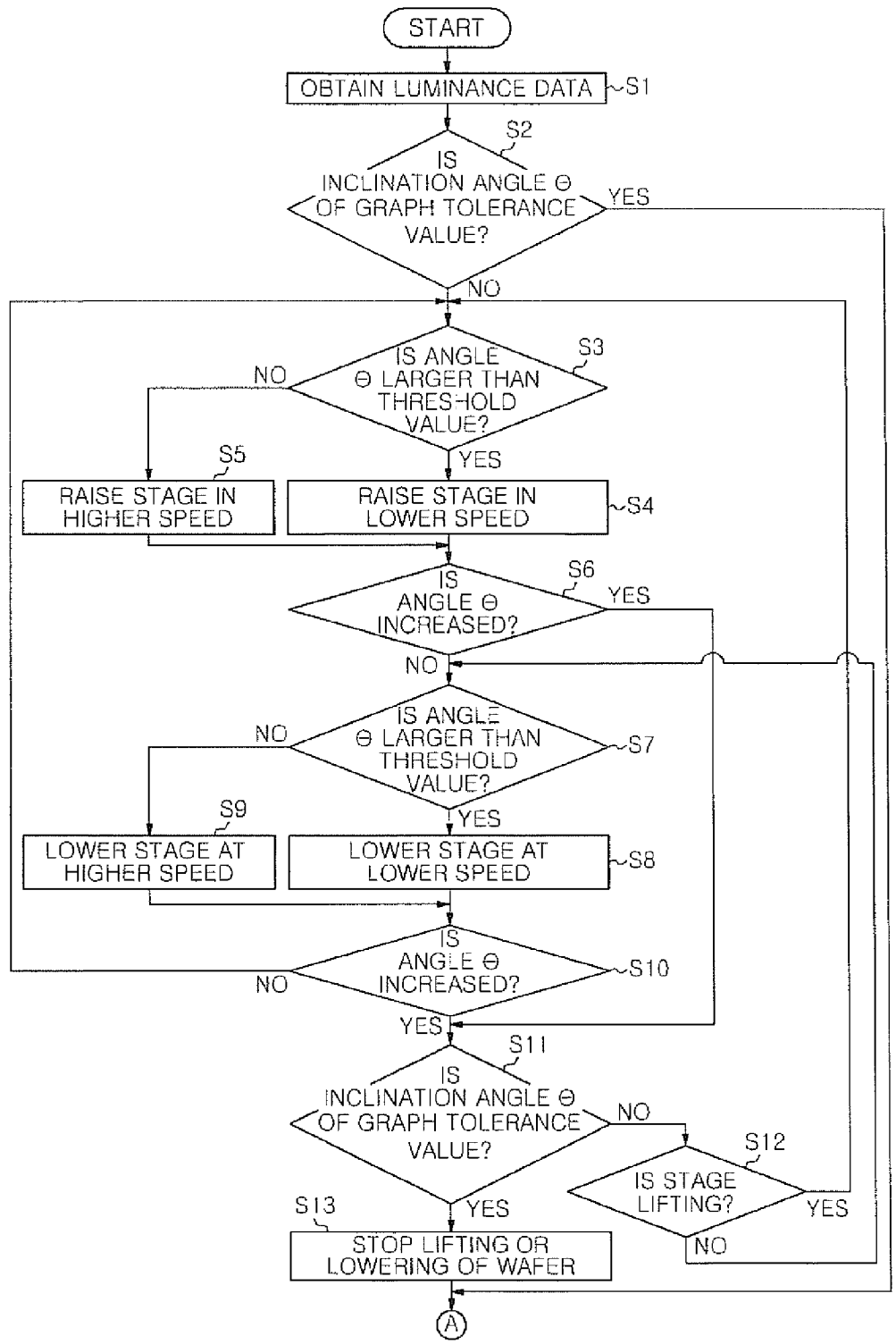
FIGS. 16 and 17 show a flowchart of an operation in the load-lock module.
Figure 17:
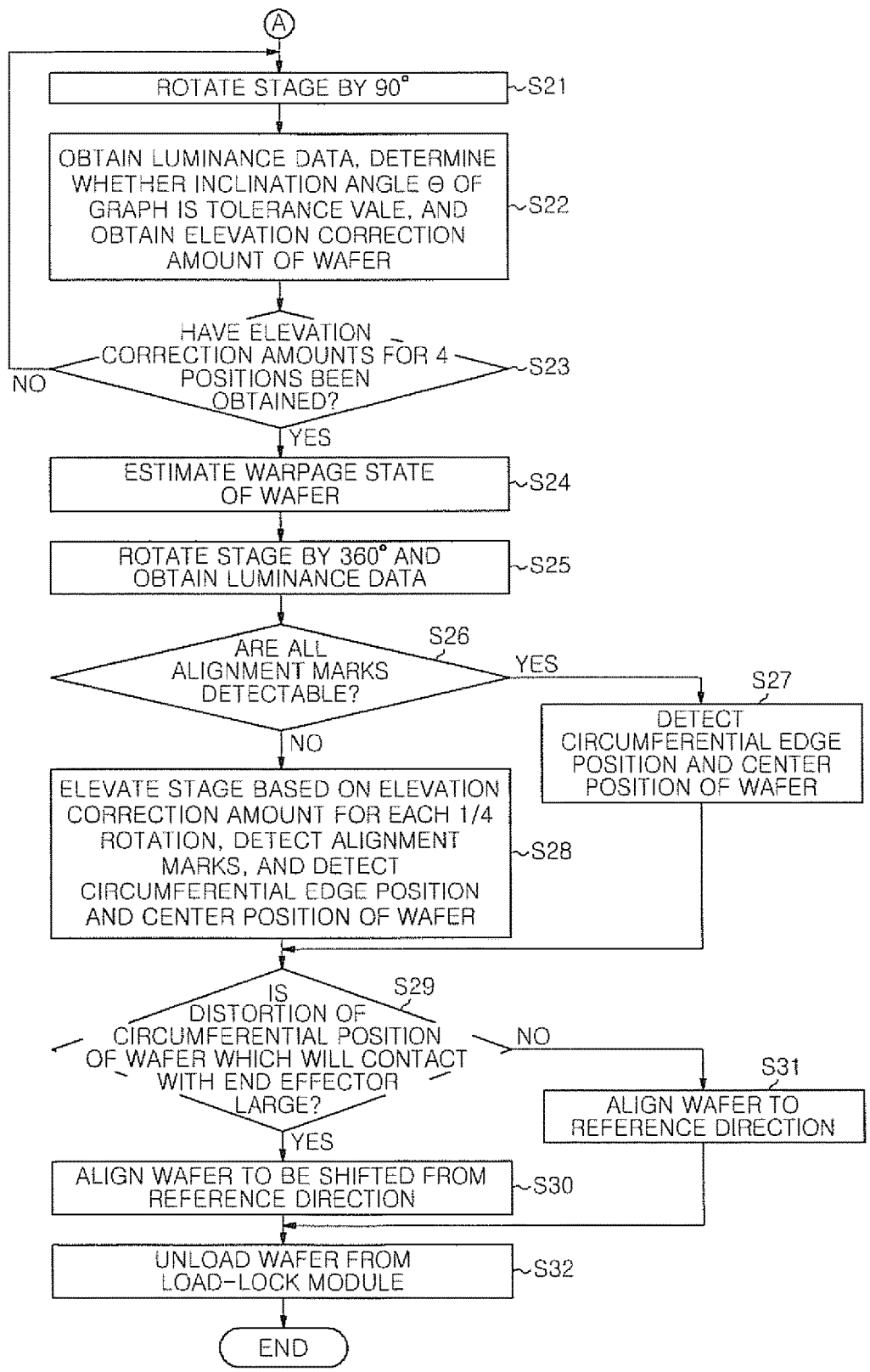

Next, the sequence of an operation performed when the wafer W is loaded into the load-lock module 3A will be described with reference to the flowchart of FIGS. 16 and 17. First, the wafer W is mounted on the stage 34 by the reciprocating movement of the second wafer transfer unit 22 and the vertical movement of the stage 34 (and/or the vertical movement of the second wafer transfer unit 22). Then, the light is irradiated from the optical unit 44 to the backside of the wafer W and the imaging is performed by the camera 48. As a consequence, the luminance data is obtained (step S1). The position of the wafer W where the luminance data is obtained is set to the aforementioned 0° position.

The luminance distribution graph described in FIG. 11 or the like is created from the luminance data, and the inclination angle θ of the graph at the boundary between the wafer W and the outside region of the wafer W is detected. Then, it is determined whether or not the angle θ is a preset tolerance value (step S2). When the angle θ is not the tolerance value, it is determined whether or not it is greater than a preset threshold value (step S3). The threshold value is set to be smaller than the tolerance value.

When it is determined to be greater than the threshold value (when the angle θ is close to the tolerance value), the stage 34 is raised at a first speed (step S4). When it is determined that the angle θ is smaller than the threshold value (when the angle θ is not close to the tolerance value), the stage 34 is raised at a second speed higher than the first speed (step S5). The elevation speed of the stage 34 is different depending on the angle θ. Accordingly, the wafer W included in the depth of field of the camera 48 is prevented from being deviated from the depth of field by the excessive lifting of the stage 34 and, also, the staying time of the wafer W in the load-lock module 3A is shortened.

The acquisition of the luminance data is continued during the lifting of the stage 34 and it is determined whether or not the inclination angle θ of the luminance distribution graph created from the luminance data is increased (step S6). When the angle θ is increased, the wafer W becomes closer to the depth of field and, thus, the lifting of the stage 34 is continued. When the angle θ is decreased, the wafer W becomes far from the depth of field. Therefore, the lifting of the stage 34 is stopped and it is determined whether or not the inclination angle θ of the luminance distribution graph obtained at the stop position is greater than the threshold value (step S7). When it is determined to be greater than the threshold value, the stage is lowered at the first speed (step S8). When it is determined to be smaller than the threshold value, the stage 34 is lowered at the second speed higher than the first speed (step S9).

The acquisition of the luminance data is continued during the lowering of the stage 34 and it is determined whether or not the inclination angle θ of the luminance distribution graph created from the luminance data is increased (step S10). When it is determined in the step S10 that the angle is not increased, the lowering of the stage 34 is stopped and the steps following the step S3 are executed again. In other words, the stage 34 is raised. Whether or not the inclination angle θ of the luminance distribution graph is increased is monitored during the lifting and the lowering of the stage 34. When it is determined that the angle θ is not increased, the moving direction of the stage 34 is changed such that the angle θ is increased.

When it is determined in the step S6 that the angle θ is increased by the lifting of the stage 34 and also when it is determined in the step S10 that the angle θ is increased by the lowering of the stage 34, it is determined whether or not the angle θ is the tolerance value (step S11). If it is determined in the step S11 that the angle θ is not the tolerance value, it is determined whether or not the stage 34 is lifting (step S12). If it is determined in the step S12 that the stage 34 is lifting, the steps following the step S3 are executed. Therefore, the lifting of the stage 34 is continued at the first speed or the second speed. If it is determined in the step S12 that the stage 34 is not lifting, i.e., if it is determined that the stage 34 is lowering, the steps following the step S7 are executed. Therefore, the lowering of the stage 34 is continued at the first speed or the second speed. If it is determined in the step S11 that the angle θ is the tolerance value, the lifting or the lowering of the stage 34 is stopped (step S13). This stop position is set to the height position having the elevation correction amount of zero which is described in FIG. 13. If it is determined in the step S2 that the inclination angle θ of the graph is the tolerance value, the lifting of the stage 34 is not carried out. The height position of the stage 34 where the wafer W is received is set to the height position having the elevation correction amount of zero.

When the height position where the elevation correction amount obtained at the 0° position of the circumference of the wafer W is zero is determined, the acquisition of the luminance data is stopped and the stage 34 rotates by 90° in a clockwise direction when viewed from the top and stops (step S21). Then, the operations of the steps S1 to S13 are carried out. In other words, the luminance data at the 90° position of the circumference of the wafer W is obtained. Next, the stage 34 is lifted so that the angle θ becomes the tolerance value and the lifting of the stage 34 is stopped. The elevation correction amount at the 90° position is obtained from the height position where the lifting of the stage 34 is stopped (step S22). If it is determined in the step S2 executed at the 90° position that the inclination angle θ of the graph is the tolerance value, the elevation correction amount becomes zero. Next, it is determined whether or not the elevation correction amount has been obtained at all positions (0°, 90°, 180° and 270°) of the circumference of the wafer W (step S23). The steps S21 to S23 are repeated until the elevation correction amounts at all the positions are obtained. Accordingly, the elevation correction amount at the 180° position and that at the 270° position are obtained in that order.

When the elevation correction amount at the 270° position is obtained and it is determined in the step S23 that all the elevation correction amounts are obtained, the spline curve R is obtained based on the elevation correction amounts at the respective positions as described in FIG. 13. In other words, the estimated warpage state of the wafer W is obtained (step S24).

Since the elevation correction amount has been obtained at the 270° position, the camera 48 is focused on the wafer W at the 270° position. Therefore, the stage 34 is rotated once in a state where the height thereof is fixed and the luminance data of the entire circumference of the wafer W is obtained (step S25). Then, it is determined whether or not the alignment marks Q1 to Q3 can be detected from the luminance data (step S26). If they can be detected, the position of the circumferential edge of the entire circumference of the wafer W is detected from the luminance data of the entire circumference of the wafer W as described in FIG. 5 and the central position of the wafer W is obtained from the position of the circumferential edge (step S27).

If it is determined in the step S26 that any one of the alignment marks Q1 to Q3 cannot be detected, the height of the stage 34 is adjusted based on the elevation correction amount whenever the wafer W is rotated by 90° based on the position of the circumferential edge of the wafer W and the alignment marks Q1 to Q3 are detected. To be specific, when the step S25 is completed, the camera 48 is focused on the 270° position. Therefore, the stage 34 is rotated by 90° at a fixed height and the luminance data is obtained during the rotation. The 0° position of the wafer W is included in the imaging region 40, so that the height of the stage 34 is adjusted such that the camera 48 is focused on the 0° position. Next, the wafer W is rotated by 90° and the luminance data is obtained during the rotation.

The 90° position of the wafer W is included in the imaging region 40, so that the height of the stage 34 is adjusted such that the camera 48 is focused on the 90° position. Then, the wafer W is rotated by 90° and the luminance data is obtained during the rotation. Next, the height of the stage 34 is adjusted such that the camera 48 is focused on the 180° position. Thereafter, the wafer W is rotated by 90° and the luminance data is obtained during the rotation. The operation that adjusts the height of the stage 34 to focus the camera 48 on each position is carried out based on the elevation correction amounts thus obtained. The alignment marks Q1 to Q3, the position of the circumferential edge of the wafer W, and the central position of the wafer W are detected from the luminance data of the entire circumference of the wafer W which are obtained an interval of 90° (step S28).

If the alignment marks Q1 to Q3 are detected in the step S27 or S28, the alignment marks Q1 to Q3 are directed to the reference orientation. Then, it is determined whether or not the distortion is large at the circumferential position of the wafer W which is brought into contact with the end effector 17B of the first wafer transfer unit 17 when receiving the wafer W (step S29).

If it is determined that the distortion is large, the orientation of the wafer W is adjusted such that a position where the distortion is small is brought into contact with the end effector 17B by the rotation of the stage 34 as described in FIG. 15 (step S30). If it is determined that the distortion is small, the orientation of the wafer W is adjusted by rotating the stage 34 such that the alignment marks Q1 to Q3 are directed in the reference orientation (step S31). Next, the wafer W is received by the first wafer transfer unit 17 such that the central position of the wafer W whose orientation has been adjusted is located at a predetermined position on the end effector 17B, and then is unloaded from the load-lock module 3A (step S32).

In the load-lock module 3B as well as in the load-lock module 3A, the operations of the steps S1 to S32 are executed. In the step S32, the wafer W is received by the second wafer transfer unit 22, instead of the first wafer transfer unit 17, and unloaded from the load-lock module 3B. In the load-lock module 3B, the step S24 is executed. If the warpage state of the wafer W is estimated, whether or not the wafer W may be damaged is determined based on the area corresponding to the warpage which is surrounded by the horizontal axis of the graph and the spline curve R described in FIG. 13. The determination result is stored.

Hereinafter, the transfer path of the wafer W in the entire substrate processing apparatus 1 will be described. The wafer W in the carrier C is loaded into the loader module 13 by the second transfer unit 22 and then transferred to the load-lock module 3A maintained at an atmospheric atmosphere. In the load-lock module 3A, the inside of the chamber 31 is exhausted from the gas exhaust port 39 to a vacuum atmosphere of a predetermined pressure, and the operations of the steps S1 to S31 are executed. Next, the wafer W is transferred to the first wafer transfer unit 17. In other words, the step S32 is executed. The wafer W is transferred to the processing module 12 by the first wafer transfer unit 17 and subjected to an etching process.

The processed wafer W is transferred to the first wafer transfer unit 17 and then to the load-lock module 3B having the chamber 31 maintained at a vacuum atmosphere. In order to maintain the inside of the chamber 31 to the atmospheric atmosphere, $N_2$ gas is supplied into the chamber 31 and the operations of the steps S1 to S31 are executed. Then, the wafer W is transferred to the second wafer transfer unit 22. In other words, the step S32 is executed. The wafer W returns to the carrier C by the second wafer transfer unit 22.

In the substrate processing apparatus 1, the pattern of the luminance distribution of the outside region of the wafer W and the circumferential edge of the backside of the wafer W is obtained by the imaging of the camera 48. Then, the stage 34 which mounts thereon the wafer W is lifted and the height of the stage 34 with respect to the camera 48 is set based on the variation of the luminance distribution near the boundary between the circumferential edge of the wafer W and the outside region of the wafer W. Therefore, even if the wafer W is warped, the camera 48 can be focused on the circumferential edge of the wafer W. Accordingly, the alignment marks Q1 to Q3 can be detected with high accuracy. Further, the camera 48 does not require the autofocus function, so that the manufacturing cost of the load-lock modules 3A and 3B can be reduced. The warpage estimation data of the wafer W is obtained from the elevation amount of the stage 34 which is required for the focusing operation and obtained at, e.g., four positions of the circumference of the wafer W. Then, whether the wafer W may be damaged or not is estimated from the estimation data. Accordingly, an unnecessary process for the wafer W is not performed in a next step performed in the substrate processing apparatus 1, which makes the productivity of the semiconductor device increased. Further, it is possible to prevent the end effectors 17B and 22B from supporting the positions of the wafer W where the distortion is large by using the estimated data, so that the wafer W can be prevented from being separated or misaligned from the end effectors 17B and 22B. As a result, the deterioration of the production yield of the substrate processing apparatus 1 can be suppressed.

The substrate processing apparatus 1 has a function of determining whether or not it is normally based on the obtained elevation correction amount. To be specific, in the same wafer W, when a value obtained by subtracting the area corresponding to the warpage obtained in the load-lock module 3A from the area corresponding to the warpage obtained in the load-lock module 3B is greater than the threshold value, it is determined that the processing in the processing module 12 and/or the transfer in the processing module 12 and the transfer module 11 forming the transfer chamber for the wafer W are abnormal and the wafer W has large warpage. The determination result is displayed on the display device 53 of the control unit 5. The determination of the abnormality of the apparatus 1 by the control unit 5 is carried out by the steps S25 to S32 after the spline curve R is obtained in the load-lock module 3B, for example.

In the above example, the height of the camera 48 is fixed and the stage 34 is vertically moved. However, instead, the camera 48 may be connected to the elevation unit and vertically moved with respect to the stage 34 in a state where the height of the stage 34 is fixed. In the case of lifting the stage 34 by the inclination angle θ of the luminance distribution graph in the steps S3 to S13, if the angle θ is smaller than the threshold value, the stage may be increased or decreased continuously. When the angle θ is greater than the threshold value, the stage 34 may be intermittently increased or decreased. When the stage 34 is continuously increased or decreased, the moving amount per unit time is large. When the stage 34 is intermittently increased or decreased, the moving amount per unit time is small. Accordingly, it is possible to prevent the camera 48 that has been focused on the wafer W from being unfocused.

The transfer speed of the wafer W by the first wafer transfer unit 17 and the second wafer transfer unit 22 may be changed depending on the areas corresponding to the warpage which are obtained in the load-lock modules 3A and 3B, i.e., depending on the warpage state of the wafer W. To be specific, the warpage amount of the wafer W is increased as the area corresponding to the warpage is increased and, thus, the transfer speed is decreased to correspond to the area corresponding to the warpage. By changing the transfer speed, the wafer W can be prevented from being separated or misaligned from the end effectors 17B and 22B.

The warpage of the wafer W can be improved by cooling or heating the wafer W. For example, in the load-lock module 3B, there is calculated the area corresponding to the warpage in the wafer W where the spline curve R is obtained. Then, the staying time of the wafer W in the load-lock module 3B is determined by the area corresponding to the warpage. While the wafer W exists in the load-lock module 3B, $N_2$ gas having a temperature lower than that of the wafer W is supplied through the gas supply port 3 of the load-lock module 3B. In other words, the cooling time of the wafer W may be determined depending on the warpage state of the wafer W.

To be more specific, the staying time of the wafer W in the load-lock module 3B is determined by adding an extended time determined by the area corresponding to the warpage to a preset time. The staying time indicates a period of time in which the gate valves 32 and 33 are closed and the load-lock module 3B is air tightly sealed. By changing the cooling time depending on the warpage state of the wafer W, the warpage of the wafer W unloaded from the load-lock module 3B can be improved. As a result, the flatness of the wafer W can be improved.

Moreover, the heater may be provided at the stage 34 to heat the wafer W in the load-lock module 3B. The staying time of the wafer W in the load-lock module 3B or the temperature of the wafer W may be determined depending on the warpage state of the wafer W. In other words, the heating time or the temperature of the wafer W may be determined depending on the warpage state of the wafer W. By controlling the heating time or the temperature, the warpage of the wafer W unloaded from the load-lock module 3B can be improved and, further, the flatness of the wafer W can be improved. In the load-lock module 3A as well, the temperature of the stage 34 or the time for controlling the temperature of the wafer W, i.e., the cooling/heating time, may be changed depending on the warpage state of the wafer W.

In the load-lock module 3A, the area corresponding to the warpage of the wafer W is obtained. When the wafer W is unloaded from the load-lock module 3A and transferred to the processing module 12, the time for heating the wafer W by the heater provided at the stage 14 of the processing module 12 may be changed to correspond to the area corresponding to the warpage. In other words, the mounting time of the wafer W on the stage 14 is changed depending on the area corresponding to the warpage. Accordingly, the heating time of the wafer W may be changed.

In the above example, the warpage state of the wafer W is estimated from the height position of the stage which is obtained by performing the focusing operation at four positions of the circumference of the wafer W. The warpage state of the wafer W may be estimated by performing the focusing operation at five or more locations. Since the warpage state of the wafer W can be estimated by the curve fitting based on the data obtained by performing the focusing operation at three or more positions of the circumference of the wafer W, the focusing operation may be performed only at three locations. In the case of performing the focusing operation only at three locations as well as in the above-described case of performing the focusing operation at, e.g., four positions, the wafer W is rotated in a state where the camera is focused on a single circumferential position of the wafer W and the luminance data is obtained. When another circumferential position where the focusing operation is performed is included in the imaging region 40, the stage 34 is lifted. Then, the wafer W is rotated in a state where the camera is focused on that circumferential position and the luminance data is obtained. In other words, the luminance data is obtained in a state where the camera is focused on three positions of the circumference of the wafer W, and the alignment marks Q1 to Q3 are detected from the luminance data.

While the disclosure has been shown and described with respect to the embodiments, it will be understood by those skilled in the art that various changes and modifications may be made without departing from the scope of the disclosure as defined in the following claims.

What is claimed is:

1. An alignment apparatus for aligning a wafer that is a circular substrate in a predetermined orientation by optically detecting an alignment mark formed at a backside of the wafer by rotating a mounting unit on which the wafer is mounted, comprising:

an imaging unit configured to image, from a position below the wafer, an imaging region having a strip shape extending in a diametrical direction of the wafer across a periphery of the wafer;

an elevation unit configured to relatively move up and down the mounting unit or the imaging unit with respect to each other;

a control unit configured to output a control signal for controlling the elevation unit such that a luminance variation between an outer side and an inner side of the wafer in a luminance distribution pattern in the diametrical direction of the wafer which is obtained by the imaging unit becomes a luminance variation obtained when the imaging unit is focused, for estimating a warpage state of the wafer based on an amount of relative movement of the imaging unit and the mounting unit with respect to a relative height position of the imaging unit and the mounting unit which is obtained when the imaging unit is focused on a reference wafer having no warpage, and for detecting the alignment mark of the wafer by the imaging unit by rotating the mounting unit in a state where the imaging unit is focused.

2. The alignment apparatus of claim 1, wherein the control unit allows the imaging unit to perform imaging at three or more positions along a circumferential direction of the wafer and controlling the elevation unit at each position, and estimates a warpage state of the wafer based on the relative movement amount of the imaging unit which is obtained at each position.

3. The alignment apparatus of claim 1, wherein the control unit detects the alignment mark in a state where the imaging unit is focused on each of three or more positions.

4. The alignment apparatus of claim 1, wherein the control unit detects the alignment mark in a state where the imaging unit is focused on one position in the circumferential direction of the wafer, and when the alignment mark is not detectable, the control unit detects the alignment mark in a state where the imaging unit is focused on each of three or more positions.

5. The alignment apparatus of claim 1, wherein controlling the elevation unit includes obtaining a luminance variation by setting the imaging unit to a first relative height position, obtaining a luminance variation by setting the imaging unit to a second relative height position by setting the elevation unit, and determining whether the elevation unit is to be moved upward or downward from the second relative height position based on a result of comparison between the luminance variations at the respective height positions.

6. A substrate processing apparatus including the alignment apparatus according to claim 1, comprising:

a wafer temperature control unit including at least one of a heating unit for heating a wafer and a cooling unit for cooling a wafer, wherein the temperature control unit performs temperature control to correct warpage states of wafers in different manners based on estimated warpage states of the wafers.

7. The substrate processing apparatus of claim 6, wherein the different manners include setting of different periods of time for controlling temperatures of the wafers or setting of different temperatures for the wafer.

8. A substrate processing apparatus including the alignment apparatus according to claim 1, comprising:

a transfer chamber configured to receive and deliver a wafer;

a transfer unit configured to transfer a wafer between the transfer chamber and the alignment apparatus; and a determination unit configured to determine whether or not the wafer is warped after the wafer is transferred to the transfer chamber, based on a warpage state of the wafer which is estimated by the alignment apparatus before the wafer is transferred to the transfer chamber and a warpage state of the wafer which is estimated by the alignment apparatus after the wafer is transferred to the transfer chamber.

9. A substrate processing apparatus including the alignment apparatus according to claim 1, comprising:

a transfer chamber configured to receive and deliver a wafer;

a transfer unit configured to transfer a wafer between the transfer chamber and the alignment apparatus; and a positioning unit configured to determine, when the wafer is transferred, a position where the wafer is received by the transfer unit based on the estimated warpage state of the wafer.

* * * * *